US009581898B2

(12) United States Patent
Liou et al.

(10) Patent No.: US 9,581,898 B2
(45) Date of Patent: Feb. 28, 2017

(54) MANUFACTURING METHOD OF PATTERN TRANSFER MASK

(71) Applicant: UNITED MICROELECTRONICS CORP., Hsin-Chu (TW)

(72) Inventors: En-Chiuan Liou, Tainan (TW); Chia-Hsun Tseng, Tainan (TW); Tuan-Yen Yu, Tainan (TW); Po-Tsang Chen, Tainan (TW); Yi-Ting Chen, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 169 days.

(21) Appl. No.: 14/685,615

(22) Filed: Apr. 14, 2015

(65) Prior Publication Data
US 2016/0306274 A1    Oct. 20, 2016

(51) Int. Cl.
*G03F 1/76* (2012.01)
*G03F 1/80* (2012.01)
*H01L 21/033* (2006.01)

(52) U.S. Cl.
CPC . *G03F 1/76* (2013.01); *G03F 1/80* (2013.01); *H01L 21/0337* (2013.01)

(58) Field of Classification Search
CPC ........... G03F 1/76; G03F 1/80; H01L 21/0337
USPC ...................................... 430/5, 30
See application file for complete search history.

(56) References Cited

U.S. PATENT DOCUMENTS 7,598,007 B2    10/2009    Yamamoto
7,897,299 B2    3/2011    Yoon

OTHER PUBLICATIONS

Chris A. Mack, Depth of Focus, The Lithography Tutor (Spring 1995).
Jo Finders, The impact of Mask 3D and Resist 3D effects in optical lithography, Proc. of SPIE vol. 9052, Optical Microlithography XXVII, 905205, Mar. 31, 2014.
Guoxiang Ning, Jacky Cheng, Sergey Kropinov, Lloyd C. Litt, Dongqing Zhang, Paul Ackmann, Yee Mei Foong, Effect of mask 3D and scanner focus difference on OPC modeling and verification, Proc. of SPIE vol. 9052, Optical Microlithography XXVII, 905221, Mar. 31, 2014.

*Primary Examiner* — Christopher Young
(74) *Attorney, Agent, or Firm* — Winston Hsu; Scott Margo

(57) ABSTRACT

A manufacturing method of a pattern transfer mask includes the following steps. A basic mask is provided. The basic mask includes a plurality of patterns formed by a patterned absorber layer on a substrate according to a first writing layout. A photolithographic process is then performed by the basic mask to obtain individual depth of focus (iDoF) ranges of each of the patterns and a usable depth of focus (UDoF) range of the patterns. At least one constrain pattern dominating the UDoF range is selected from the patterns in the basic mask. The rest of the patterns except the constrain pattern are non-dominating patterns. A second writing layout is then generated for reducing a thickness of the patterned absorber layer in the constrain pattern or in the non-dominating patterns.

12 Claims, 10 Drawing Sheets

MANUFACTURING METHOD OF PATTERN TRANSFER MASK

BACKGROUND OF THE INVENTION

1. Field of the Invention

The present invention relates to a manufacturing method of a pattern transfer mask, and more particularly, to a manufacturing method of a pattern transfer mask with an improved usable depth of focus (UDoF) range.

2. Description of the Prior Art

In the continuously improved semiconductor integrated circuit technology, the patterns of the semiconductor devices become finer for increasing the integrity of the integrated circuit. However, the finer the pattern becomes, the smaller the requirement for size uniformity becomes. As the patterns are generally formed by photolithography processes, deviations in the exposure process may be a factor influencing the size uniformity of the patterns.

In the exposure process, many parameters such as the exposure amount and the depth of focus may contribute to the critical dimension (CD) results. The pattern transfer mask used in the exposure process generally has pattern groups with different pattern densities. Based on the acceptable CD variation ranges of the result patterns, each of the pattern groups on the pattern transfer mask has an individual depth of focus (iDoF) range, and a usable depth of focus (UDoF) range of the pattern transfer mask can be defined by the iDoF ranges of the pattern groups with different pattern densities. As the integrated circuit designs become more complicated, the UDoF range of the pattern transfer mask becomes smaller, and the process window will be limited accordingly.

SUMMARY OF THE INVENTION

According to the claimed invention, a manufacturing method of a pattern transfer mask is provided. The manufacturing method includes the following steps. A basic mask is provided. The basic mask includes a plurality of patterns formed by a patterned absorber layer on a substrate according to a first writing layout. A photolithographic process is then performed by the basic mask to obtain individual depth of focus (iDoF) ranges of each of the patterns and a usable depth of focus (UDoF) range of the patterns. At least one constrain pattern dominating the UDoF range is selected from the patterns in the basic mask. The rest of the patterns except the constrain pattern are non-dominating patterns. A second writing layout is then generated for reducing a thickness of the patterned absorber layer in the constrain pattern or in the non-dominating patterns.

According to the manufacturing method of the pattern transfer mask in the present invention, the second writing layout is used to reduce the thickness of the patterned absorber layer in the constrain pattern or in the non-dominating patterns. The usable depth of focus (UDoF) range of the patterns may be improved after the thickness modification, and the process window of the photolithography process using the pattern transfer mask may be improved accordingly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 4-6 are schematic drawings illustrating the manufacturing method of the pattern transfer mask according to the first embodiment of the present invention, wherein FIG. 5 is a schematic drawing in a step subsequent to FIG. 4, and FIG. 6 is a schematic drawing in a step subsequent to FIG. 5.

DETAILED DESCRIPTION

Figure 1:
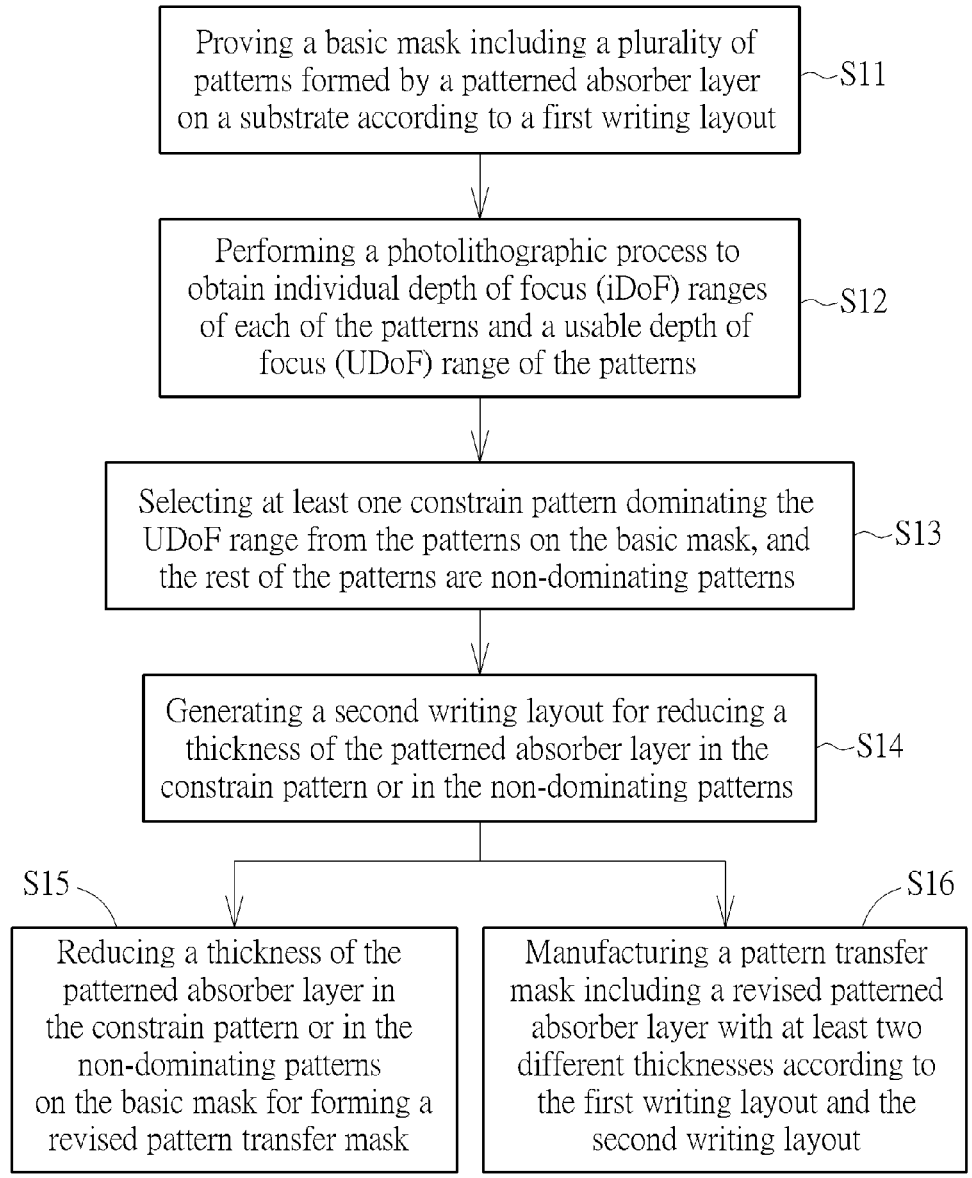
FIG. 1 is a flow chart of a manufacturing method of a pattern transfer mask according to a first embodiment and a second embodiment of the present invention.
Figure 2:
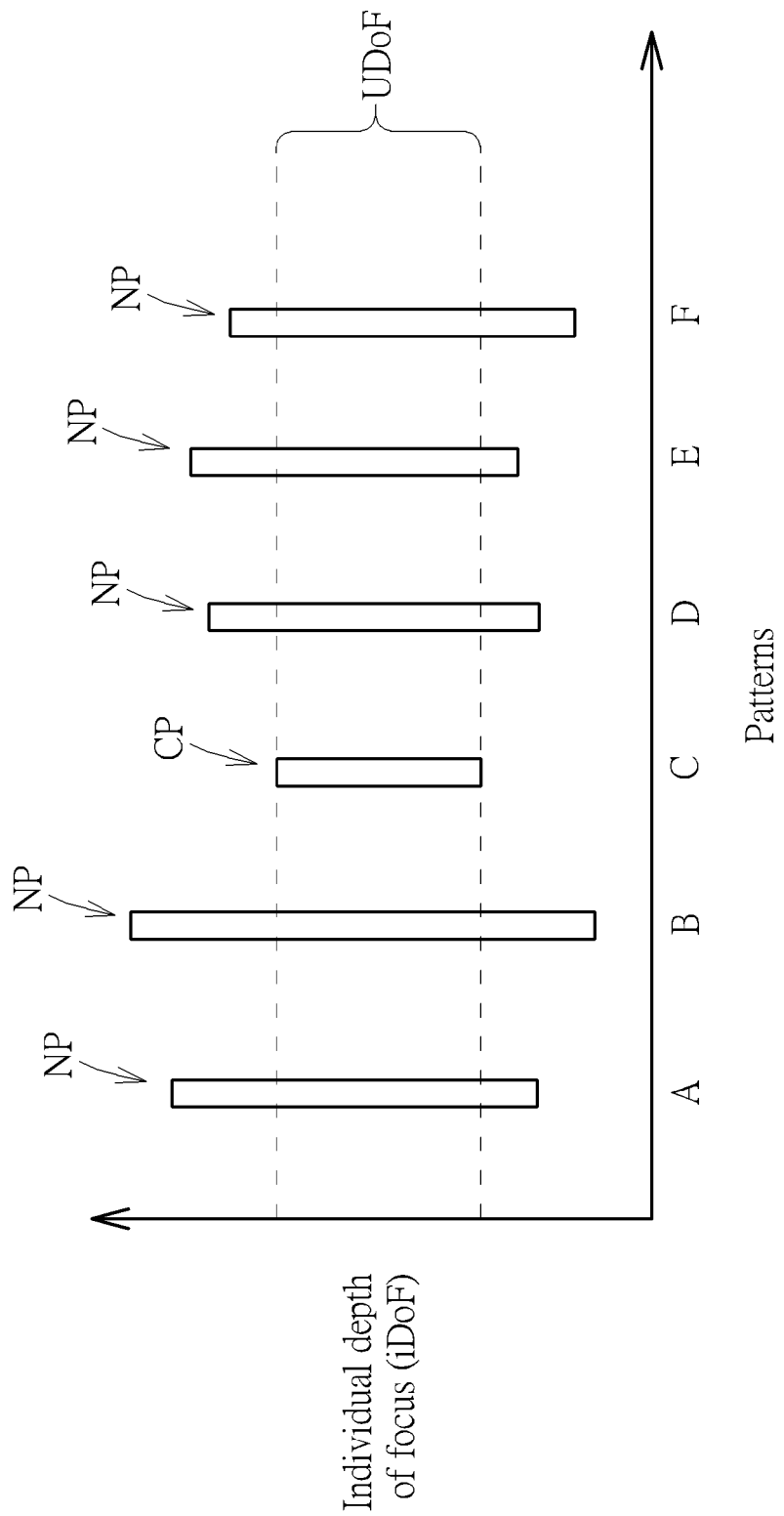
FIG. 2 is a schematic diagram illustrating distribution of individual depth of focus ranges of each of patterns in a basic mask according to a first condition of the first embodiment.
Figure 3:
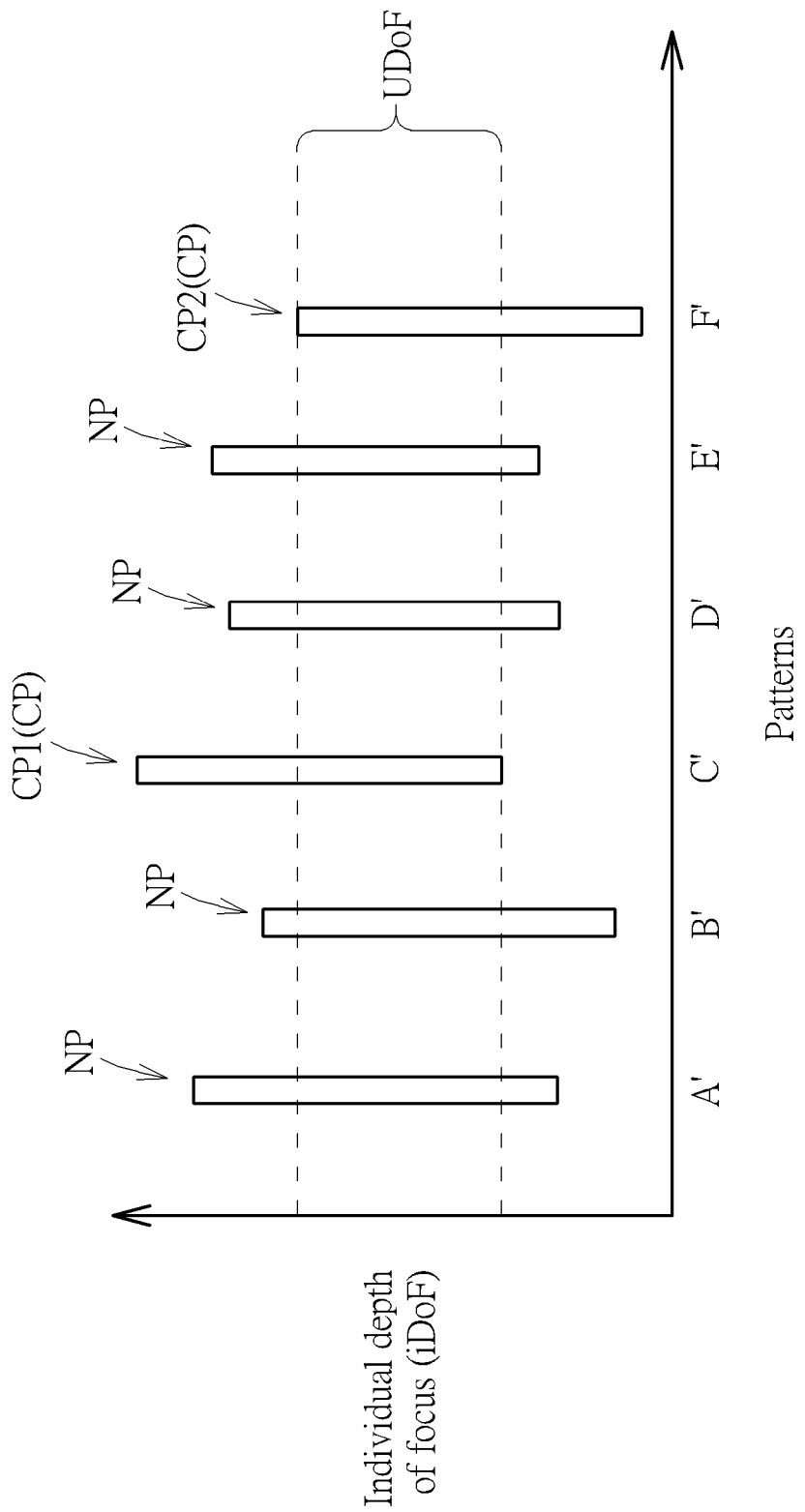
FIG. 3 is a schematic diagram illustrating distribution of individual depth of focus ranges of each of patterns in a basic mask according to a second condition of the first embodiment.
Figure 4:
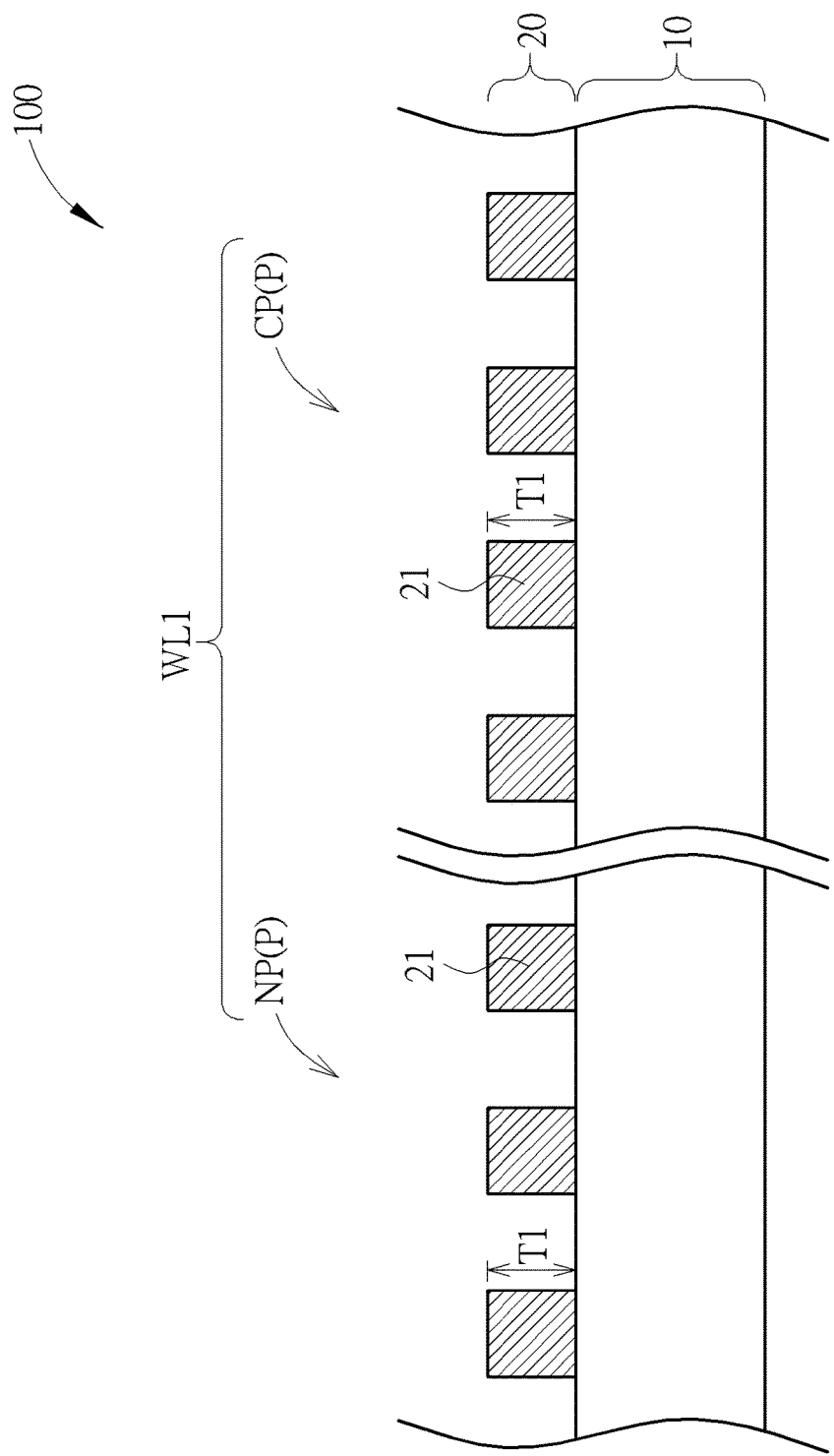
Figure 5:
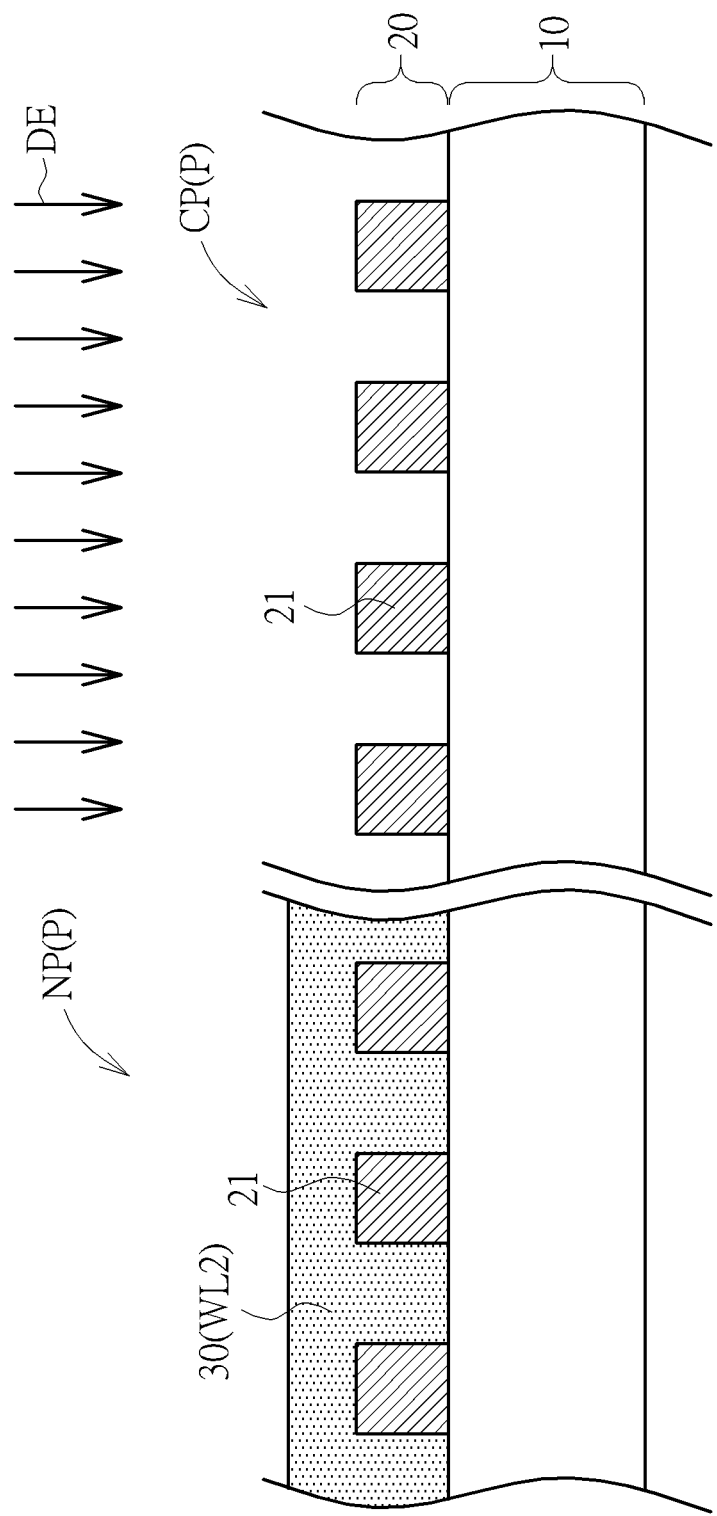
Figure 6:
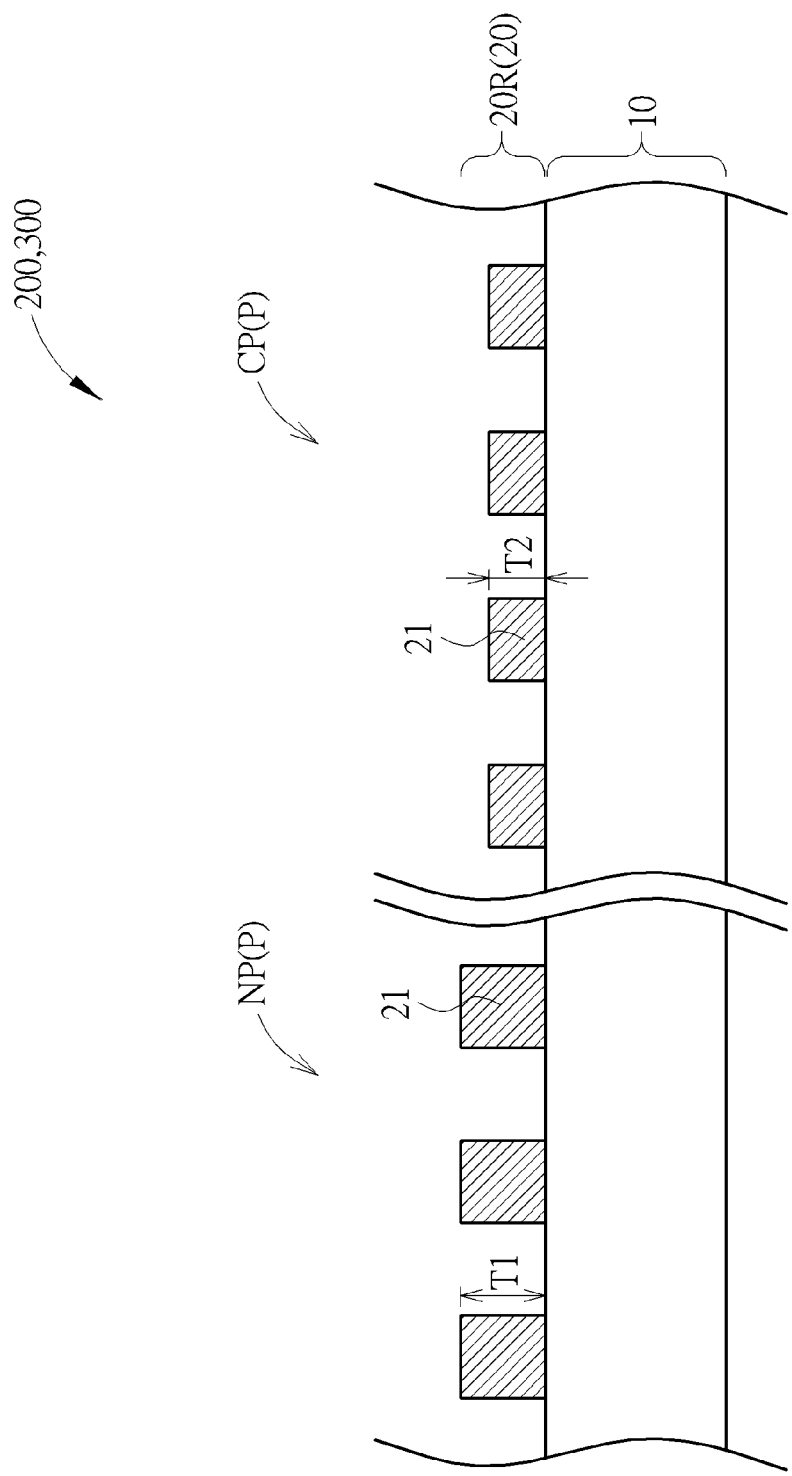

Please refer to FIGS. 1-6. FIG. 1 is a flow chart of a manufacturing method of a pattern transfer mask according to a first embodiment and a second embodiment of the present invention. FIG. 2 is a schematic diagram illustrating distribution of individual depth of focus ranges of each of patterns in a basic mask according to a first condition of the first embodiment. FIG. 3 is a schematic diagram illustrating distribution of individual depth of focus ranges of each of patterns in a basic mask according to a second condition of the first embodiment. FIGS. 4-6 are schematic drawings illustrating the manufacturing method of the pattern transfer mask according to the first embodiment of the present invention. The manufacturing method of the pattern transfer mask in the first embodiment includes the following steps. As shown in FIGS. 1-4, in step S11, a basic mask 100 is provided. The basic mask 100 includes a plurality of patterns P formed by a patterned absorber layer 20 on a substrate 10 according to a first writing layout WL1. The substrate 10 may be a transparent substrate such as a quartz substrate preferably, but not limited thereto. The patterned absorber layer 20 may be made of opaque materials such as opaque molybdenum silicide or chromium, but not limited thereto.

Subsequently, in step S12, a photolithographic process is then performed by the basic mask 100 to obtain individual depth of focus (iDoF) ranges of each of the patterns P and a usable depth of focus (UDoF) range of the patterns P. As shown in FIG. 2 and FIG. 4, the patterns P of the basic mask 100 may include patterns with different pattern densities. For example, the patterns P of the basic mask 100 may include a pattern A, a pattern B, a pattern C, a pattern D, a pattern E, and a pattern F with different pattern densities, and the iDoF ranges of these patterns are different as shown in FIG.

2, or the patterns P of the basic mask 100 may include a pattern A', a pattern B', a pattern C', a pattern D', a pattern E', and a pattern F' with different pattern densities, and the iDoF ranges of these patterns are different as shown in FIG. 3.

In step S13, at least one constrain pattern CP dominating the UDoF range may be selected from the patterns P in the basic mask 100, and the rest of the patterns P except the constrain pattern CP may be regarded as non-dominating patterns NP. The pattern having the iDoF range with a lowest upper limit or/and a highest lower limit will be the constrain pattern CP. Therefore, there may be only one constrain pattern CP, two constrain patterns CP, or more than two constrain patterns CP. For example, in a first condition shown in FIG. 2, the pattern C is the constrain pattern CP dominating the UDoF range while the pattern A, the pattern B, the pattern D, the pattern E and the pattern F are regarded as the non-dominating patterns NP. In a second condition shown in FIG. 3, the pattern C' and the pattern F' are the constrain patterns CP dominating the UDoF range while the pattern A', the pattern B', the pattern D' and the pattern E' are regarded as the non-dominating patterns NP. In other words, two constrain patterns CP dominating the UDoF range are selected from the patterns P of the basic mask 100 in the second condition.

As shown in FIGS. 1 and 4-6, in step S14, a second writing layout WL2 is then generated for reducing a thickness of the patterned absorber layer 20 in the constrain pattern CP or in the non-dominating patterns NP. In the first embodiment of the present invention, step S15 is executed after step S14, and the thickness of the patterned absorber layer 20 in the constrain pattern CP in the basic mask 100 is reduced for forming a revised pattern transfer mask 200 according to the second writing layout WL2. The thickness of the patterned absorber layer 20 may be reduced by an etching process, a laser writing process, or other appropriate methods. Specifically, as shown in FIG. 4, originally, a thickness of the patterned absorber layer 20 in the constrain pattern CP is equal to a thickness of the patterned absorber layer 20 in the non-dominating pattern NP in the basic mask 100, and the original thickness of the patterned absorber layer 20 may be regarded as a first thickness T1. The patterned absorber layer 20 may be a single layer absorber or a multi-layered absorber. For example, the patterned absorber layer 20 in this embodiment may include only one first absorber layer 21, but not limited thereto. As shown in FIG. 5, a shielding mask 30 may be formed on the substrate 10 according to the second writing layout WL2. In this embodiment, the shielding mask 30 may cover the non-dominating pattern NP and expose the constrain pattern CP because the thickness of the patterned absorber layer 20 in the constrain pattern CP is going to be reduced by an etching process DE, but the present invention is not limited to this. In another embodiment of the present invention, the shielding mask 30 may cover the constrain pattern CP and expose the non-dominating pattern NP when the thickness of the patterned absorber layer 20 in the non-dominating pattern NP is going to be reduced.

As shown in FIG. 5 and FIG. 6, the revised pattern transfer mask 200 may be obtained after the thickness of the patterned absorber layer 20 in the constrain pattern CP is reduced. In other words, the revised pattern transfer mask 200 includes a revised patterned absorber layer 20R with at least two different thicknesses. In this embodiment, after the etching process mentioned above, a second thickness T2 of the constrain pattern CP is less than the first thickness T1 of the non-dominating pattern NP. A thickness offset value of the patterned absorber layer 20 for reducing the thickness of patterned absorber layer 20 in the constrain pattern CP or in the non-dominating patterns CP may be generated by calculations or/and simulations according to the thickness of the patterned absorber layer 20 and the first writing layout. In other words, there may be a database established to include information and experiment results of the relation between the depth of focus variations and the thickness of the patterned absorber layer 20 in different pattern density conditions. Therefore, process parameters such as the etching rate and the etching time of the etching process may be modified according to the database, and the database may also be used to generate the second writing layer and decide which part of the patterned absorber layer 20 is going to be modified. In this embodiment, the iDoF range of the constrain pattern CP is changed because the thickness of the patterned absorber layer 20 in the constrain pattern CP is reduced, and the UDoF range of the revised pattern transfer mask 200 may be enlarged accordingly. Therefore, the process window of the photolithography process using the revised pattern transfer mask 200 may be improved.

As shown in FIGS. 1 and 4-6, in the second embodiment of the present invention, step S16 is executed after step S14, and a pattern transfer mask 300 including the revised patterned absorber layer 20R with at least two different thicknesses is manufactured according to the first writing layout WL1 and the second writing layout WL2. In other words, the first writing layout WL1 and the second writing layout WL2 may be used to manufacture a whole new pattern transfer mask including the revised patterned absorber layer 20R with at least two different thicknesses. Specifically, in the manufacturing method of this embodiment, the patterned absorber layer 20 may be formed on the substrate 10 according to the first writing layout WL1. The patterned absorber layer 20 is used to form the patterns P including the constrain pattern CP and the non-dominating pattern NP. Subsequently, the thickness of the patterned absorber layer 20 in the constrain pattern CP or in the non-dominating patterns NP may be reduced according to the second writing layout WL2 so as to form the pattern transfer mask 300 including the revised patterned absorber layer 20R on the substrate 10. In the revised patterned absorber layer 20R, the second thickness T2 of the constrain pattern CP is less than the first thickness T1 of the non-dominating pattern NP, but the present invention is not limited thereto. In other embodiment of the present invention, the thickness of the patterned absorber layer 20 in the non-dominating patterns NP may be less than the thickness of the patterned absorber layer 20 in the constrain pattern CP. In addition, the thickness of the patterned absorber layer 20 may be modified by other appropriate methods and not limited by the etching process mentioned above.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 7:
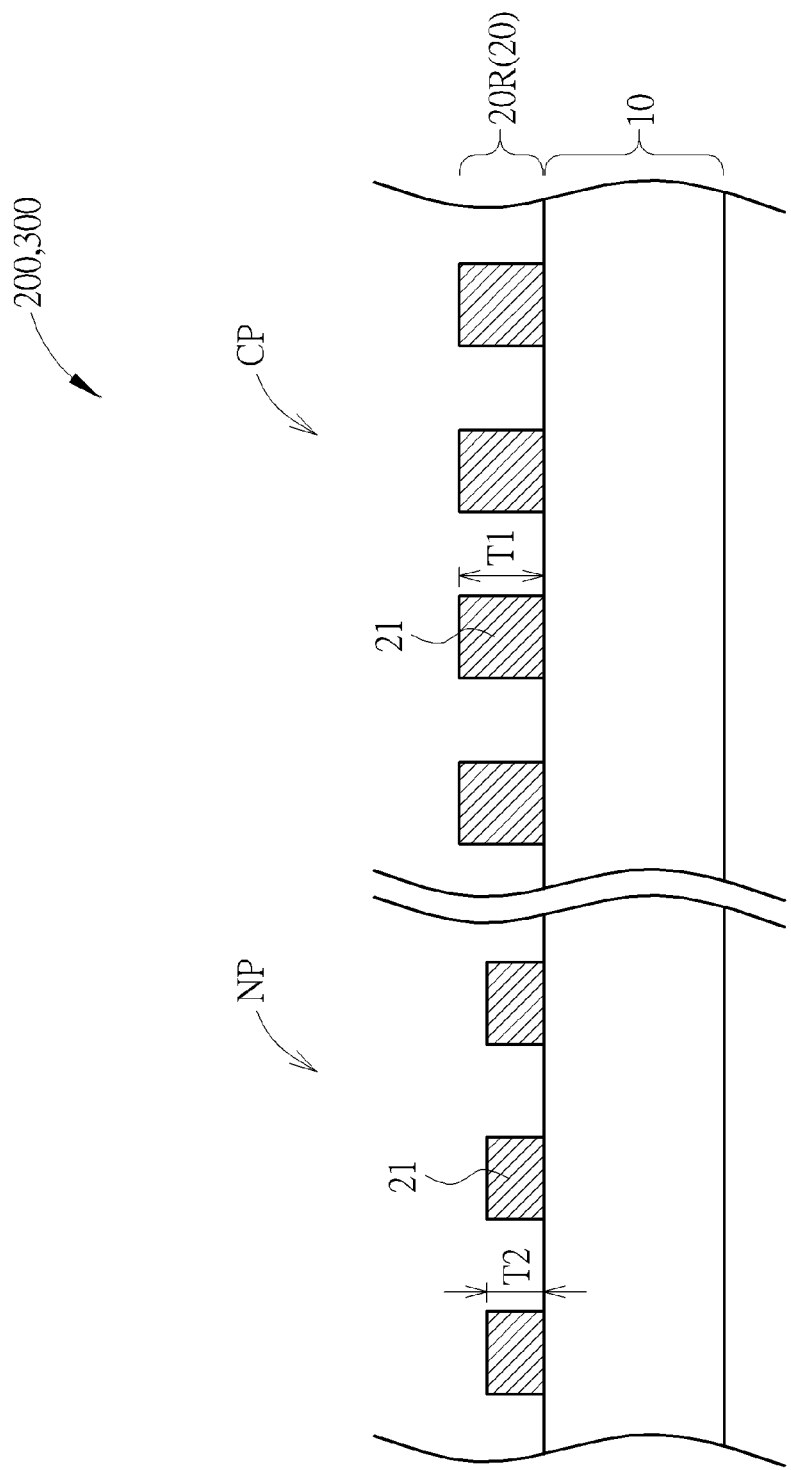
FIG. 7 is a schematic drawing illustrating a manufacturing method of a pattern transfer mask according to a third embodiment of the present invention.

Please refer to FIG. 7. FIG. 7 is a schematic drawing illustrating a manufacturing method of a pattern transfer mask according to a third embodiment of the present invention. As shown in FIG. 7, the difference between the manufacturing method of this embodiment and the manufacturing method of the above-mentioned first embodiment is that the thickness of the patterned absorber layer 20 in the non-dominating patterns NP is reduced to be the second thickness, and the thickness of the patterned absorber layer 20 n the constrain pattern CP may maintain as the first thickness. This embodiment may be applied to the revised pattern transfer mask 200 or the pattern transfer mask 300.

Figure 8:
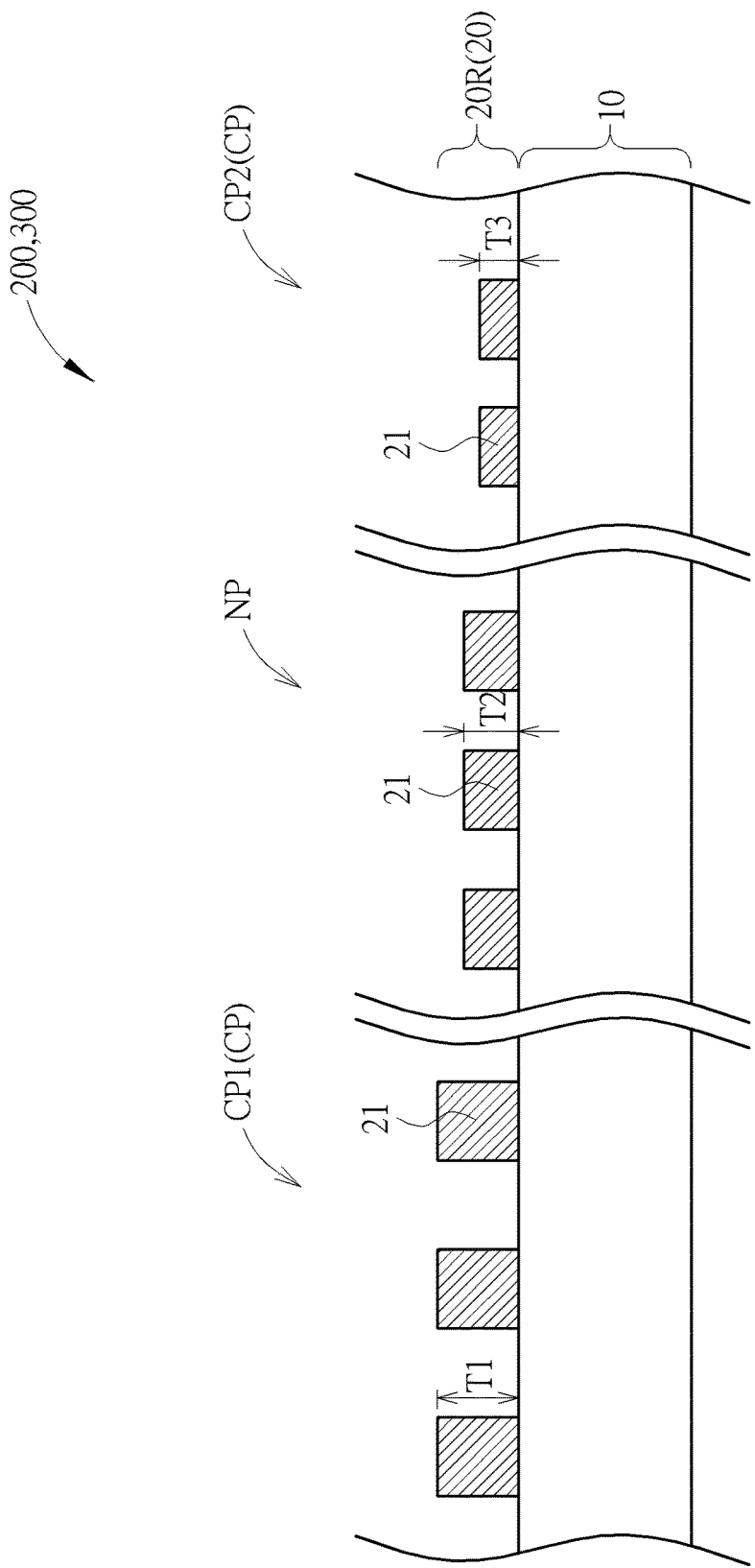
FIG. 8 is a schematic drawing illustrating a manufacturing method of a pattern transfer mask according to a fourth embodiment of the present invention.

Please refer to FIG. 8 and FIG. 3. FIG. 8 is a schematic drawing illustrating a manufacturing method of a pattern transfer mask according to a fourth embodiment of the present invention. As shown in FIG. 8 and FIG. 3, the difference between the manufacturing method of this embodiment and the manufacturing method of the above-mentioned first embodiment is that two constrain patterns CP dominating the UDoF range are selected from the patterns P, and the two constrain patterns CP may include a first constrain pattern CP1 and a second constrain pattern CP2. A thickness of the patterned absorber layer 20 in the first constrain pattern CP1 is different from a thickness of the patterned absorber layer 20 in the second constrain pattern CP2 after the thickness of the patterned absorber layer 20 in the second constrain pattern CP2 is reduced, but the present invention is not limited thereto. In other embodiment of the present invention, the thickness of the first constrain pattern CP1 may be less than the thickness of the second constrain pattern CP2 after the thickness of the patterned absorber layer 20 in the first constrain pattern CP1 is reduced. Additionally, the thickness of the non-dominating pattern NP may also be different from the first constrain pattern CP1 and the second constrain pattern CP2. For example, the first constrain pattern CP1 may have the first thickness T1, the non-dominating pattern NP may have the second thickness T2, and the second constrain pattern CP2 may have a third thickness T3. The second thickness T2 may be less than the first thickness T1, and the third thickness T3 may be less than the second thickness T2. The thickness of the patterned absorber layer 20 in the non-dominating patterns NP may be different from the thickness of the patterned absorber layer 20 in the first constrain pattern CP1 and the thickness of the patterned absorber layer 20 in the second constrain pattern CP2 after the thickness of the patterned absorber layer 20 in the non-dominating pattern NP or in the constrain patterns CP is reduced. In this embodiment, the revised patterned absorber layer 20R has three different thicknesses, but the present invention is not limited to this. In other embodiment of the present invention, the revised patterned absorber layer 20R may have more than three different thicknesses by further modifying only a part of the non-dominating patterns NP. In addition, this embodiment may also be applied to the revised pattern transfer mask 200 or the pattern transfer mask 300 mentioned above.

Figure 9:
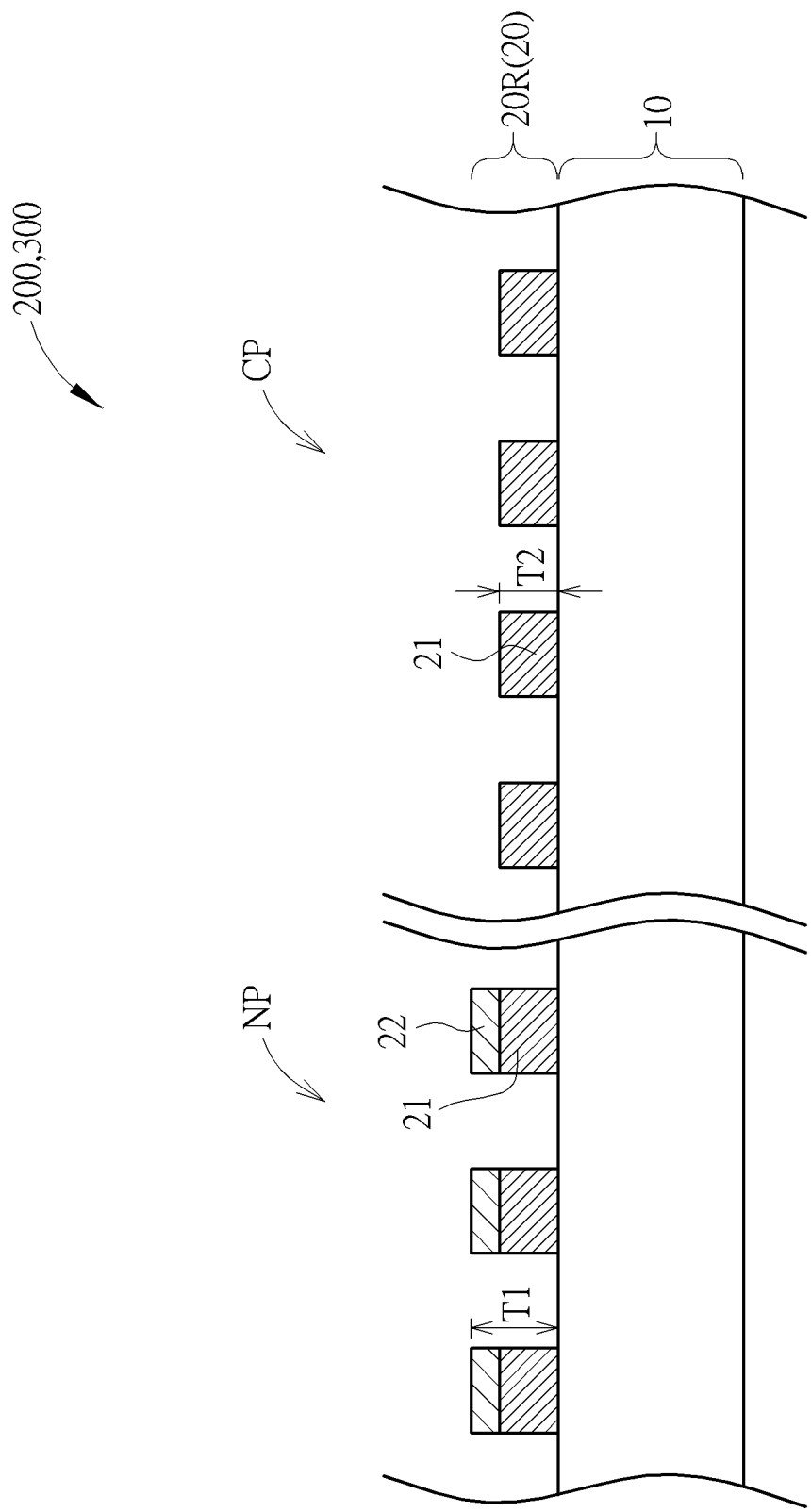
FIG. 9 is a schematic drawing illustrating a manufacturing method of a pattern transfer mask according to a fifth embodiment of the present invention.

Please refer to FIG. 9. FIG. 9 is a schematic drawing illustrating a manufacturing method of a pattern transfer mask according to a fifth embodiment of the present invention. As shown in FIG. 9, the difference between the manufacturing method of this embodiment and the manufacturing method of the above-mentioned first embodiment is that the patterned absorber layer 20 in this embodiment may include the first absorber layer 21 and a second absorber layer 22 in a stacked configuration, the second absorber layer 22 is disposed on the first absorber layer 21, and the thickness of the patterned absorber layer 20 is reduced by removing the second absorber layer 22 in the constrain pattern CP, but not limited thereto. In other embodiment of the present invention, the thickness of the patterned absorber layer 20 may also be reduced by removing the second absorber layer 22 in the non-dominating patterns NP. In this embodiment, the first absorber layer 21 may be an opaque molybdenum silicide layer, and the second absorber layer 22 may be a chromium layer, but not limited thereto.

Figure 10:
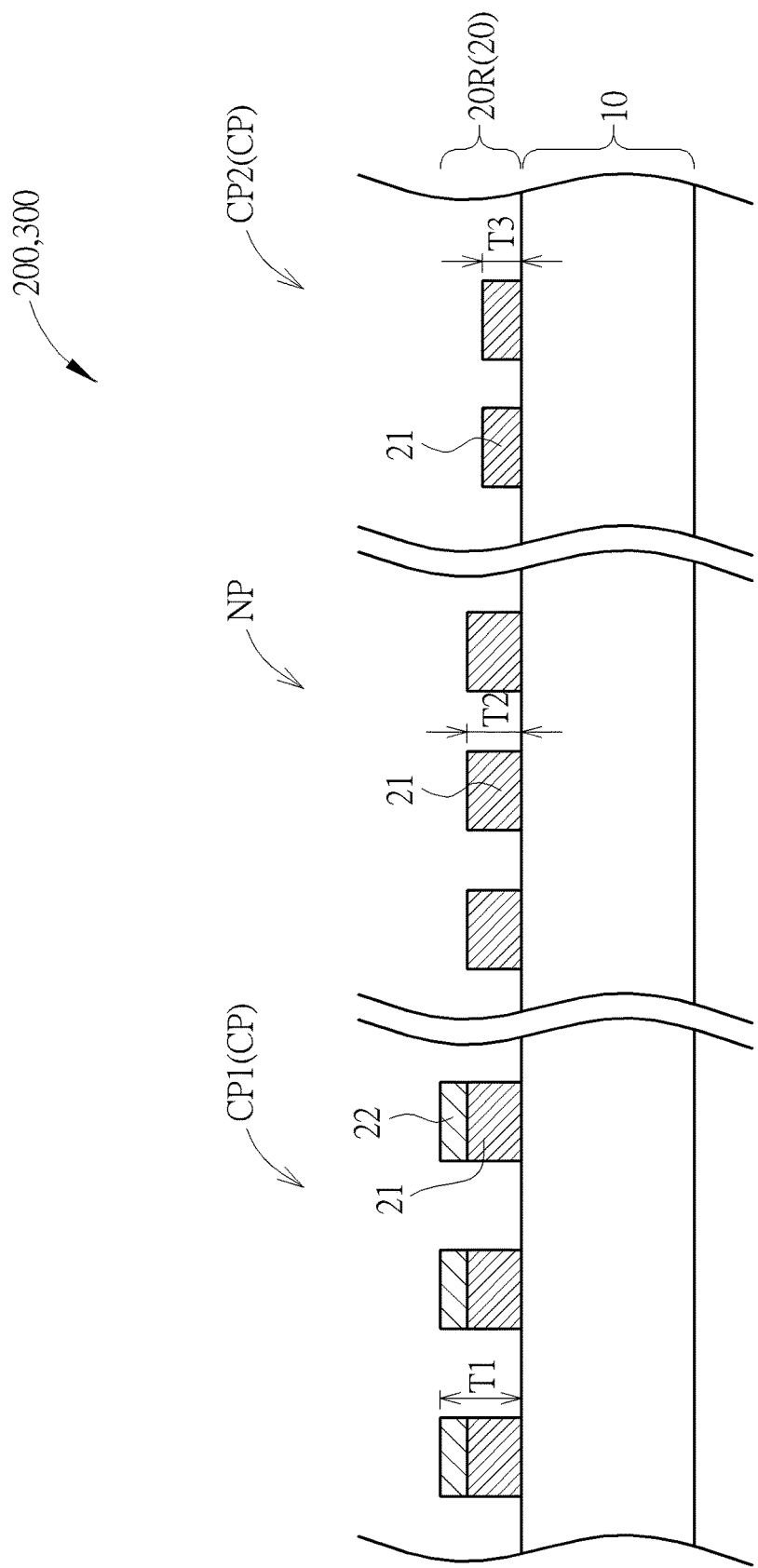
FIG. 10 is a schematic drawing illustrating a manufacturing method of a pattern transfer mask according to a sixth embodiment of the present invention.

Please refer to FIG. 10. FIG. 10 is a schematic drawing illustrating a manufacturing method of a pattern transfer mask according to a sixth embodiment of the present invention. As shown in FIG. 10, the difference between the manufacturing method of this embodiment and the manufacturing method of the above-mentioned fourth embodiment is that the patterned absorber layer 20 in this embodiment may include the first absorber layer 21 and the second absorber layer 22 in a stacked configuration, the second absorber layer 22 is disposed on the first absorber layer 21, and the thickness of the patterned absorber layer 20 is reduced by removing the second absorber layer 22 in the non-dominating patterns NP and the second constrain pattern CP2. Additionally, the thickness of the second constrain pattern CP2 may be further reduced to be equal to the third thickness by reducing the thickness of the first absorber layer 21 in the second constrain pattern CP2. In other words, the three different thickness of the revised patterned absorber layer 20R may be formed by removing a part of the second absorber layer 22 and reducing the thickness of the first absorber layer 21 in the specific pattern.

To summarize the above descriptions, in the manufacturing method of the pattern transfer mask in the present invention, the usable depth of focus (UDoF) range of the pattern transfer mask may be enlarged by modifying the thickness of the patterned absorber layer in the constrain pattern or in the non-dominating patterns. The process window of the photolithography process using the pattern transfer mask may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a pattern transfer mask, comprising:
   proving a basic mask including a plurality of patterns formed by a patterned absorber layer on a substrate according to a first writing layout;
   performing a photolithographic process by the basic mask to obtain individual depth of focus (iDoF) ranges of each of the patterns and a usable depth of focus (UDoF) range of the patterns;
   selecting at least one constrain pattern dominating the UDoF range from the patterns in the basic mask, wherein the rest of the patterns except the constrain pattern are non-dominating patterns; and
   generating a second writing layout for reducing a thickness of the patterned absorber layer in the constrain pattern or in the non-dominating patterns.

2. The manufacturing method of claim 1, further comprising:
   reducing a thickness of the patterned absorber layer in the constrain pattern or in the non-dominating patterns in the basic mask for forming a revised pattern transfer mask according to the second writing layout.

3. The manufacturing method of claim 1, wherein the thickness of the patterned absorber layer is reduced by an etching process or a laser writing process.

4. The manufacturing method of claim 1, wherein the patterned absorber layer comprises a single layer absorber or a multi-layered absorber.

5. The manufacturing method of claim 1, wherein two constrain patterns dominating the UDoF range are selected from the patterns in the basic mask.

6. The manufacturing method of claim 5, wherein the two constrain patterns comprises a first constrain pattern and a second constrain pattern, and a thickness of the patterned absorber layer in the first constrain pattern is different from a thickness of the patterned absorber layer in the second constrain pattern after the thickness of the patterned absorber layer in the first constrain pattern or/and in the second constrain pattern is reduced.

7. The manufacturing method of claim 6, wherein the thickness of the patterned absorber layer in the non-dominating patterns is different from the thickness of the patterned absorber layer in the first constrain pattern and the thickness of the patterned absorber layer in the second constrain pattern after the thickness of the patterned absorber layer in the non-dominating pattern or in the constrain patterns is reduced.

8. The manufacturing method of claim 1, wherein the patterned absorber layer comprises a first absorber layer and a second absorber layer in a stacked configuration, the second absorber layer is disposed on the first absorber layer, and the thickness of the patterned absorber layer is reduced by removing the second absorber layer in the constrain pattern or in the non-dominating patterns.

9. The manufacturing method of claim 8, wherein the first absorber layer comprises an opaque molybdenum silicide layer, and the second absorber layer comprises a chromium layer.

10. The manufacturing method of claim 1, wherein a thickness offset value of the patterned absorber layer for reducing the thickness of patterned absorber layer in the constrain pattern or in the non-dominating patterns is generated by calculations or/and simulations according to the thickness of the patterned absorber layer and the first writing layout.

11. The manufacturing method of claim 1, further comprising:

manufacturing a pattern transfer mask including a revised patterned absorber layer with at least two different thicknesses according to the first writing layout and the second writing layout.

12. The manufacturing method of claim 11, wherein the revised patterned absorber layer has three or more different thicknesses.

\* \* \* \* \*